(12) United States Patent
Huang (10) Patent No.: US 12,072,365 B2
(45) Date of Patent: Aug. 27, 2024

(54) JITTER NOISE DETECTOR (71) Applicant: Taiwan Semiconductor Manufacturing Co., Ltd., Hsin-Chu (TW)

(72) Inventor: Tien-Chien Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 18/232,341

(22) Filed: Aug. 9, 2023

(65) Prior Publication Data

US 2023/0400494 A1  Dec. 14, 2023

Related U.S. Application Data (60) Continuation of application No. 17/972,475, filed on Oct. 24, 2022, now Pat. No. 11,808,798, which is a
(Continued)

(51) Int. Cl.
*G01R 29/26* (2006.01)
*G01R 31/317* (2006.01)
(Continued)

(52) U.S. Cl.
CPC ....... *G01R 29/26* (2013.01); *G01R 31/31709* (2013.01); *H03K 19/01855* (2013.01);
(Continued)

(58) Field of Classification Search
CPC .... G01R 29/26; G01R 29/027; G01R 31/317; G01R 31/31709; H03K 3/03; H03K 3/017; H03K 3/356; H03K 5/24; H03K 19/094; H03K 19/173; H03K 19/0185; H03K 19/01855; H03L 7/00; H03L 7/07; H03L 7/08
(Continued)

(56) References Cited

U.S. PATENT DOCUMENTS 7,323,944 B2   1/2008   Florescu et al.
7,969,189 B2   6/2011   Petrofsky
(Continued)

OTHER PUBLICATIONS

Gantsog, E. et al., "0.89 mW On-Chip Jitter-Measurement Circuit for High Speed Clock with Sub-Picosecond Resolution", 42nd European Solid-State Circuits Conference, 2016, School of Electrical and Computer Engineering, Cornell University, Ithaca, N.Y., pp. 457-460.
(Continued)

*Primary Examiner* — Shawkat M Ali
(74) *Attorney, Agent, or Firm* — Duane Morris LLP (57) ABSTRACT

A noise detection circuit includes a first transistor configured to receive a delayed version of a clock signal; a second transistor configured to receive a delayed version of a reference clock signal; and a latch circuit, coupled to the first transistor at a first node and coupled to the second transistor at a second node, and configured to latch logic states of voltage levels at the first and second nodes, respectively, based on whether a timing difference between transition edges of the clock signal and the reference clock signal exceeds a pre-defined timing offset threshold.

20 Claims, 8 Drawing Sheets p-type Jitter Detection (pJD) Circuit

Related U.S. Application Data division of application No. 16/952,744, filed on Nov. 19, 2020, now Pat. No. 11,513,147, which is a continuation of application No. 15/944,217, filed on Apr. 3, 2018, now Pat. No. 10,845,404.

(60) Provisional application No. 62/525,656, filed on Jun. 27, 2017.

(51) Int. Cl.
| | |
|---|---|
| *H03K 19/0185* | (2006.01) |
| *H03L 7/07* | (2006.01) |
| *H03L 7/08* | (2006.01) |
| *G01R 29/027* | (2006.01) |

(52) U.S. Cl.
CPC .............. *H03L 7/07* (2013.01); *H03L 7/08* (2013.01); *G01R 29/0276* (2013.01)

(58) Field of Classification Search
USPC ...... 326/37, 66, 77, 115; 327/116, 161, 261, 327/491; 375/226, 322
See application file for complete search history.

(56) References Cited

U.S. PATENT DOCUMENTS

| | | | |
|---|---|---|---|
| 10,845,404 B2 | 11/2020 | Huang | |
| 11,513,147 B2* | 11/2022 | Huang | ................... G01R 29/26 |
| 11,808,798 B2* | 11/2023 | Huang | ..................... H03L 7/08 |

OTHER PUBLICATIONS

Ishida, M., et al., "On-Chip Circuit for Measuring Data Jitter in the Time or Frequency Domain", 2007 IEEE Radio frequency Integrated Circuits Symposium, pp. 347-350.

Hsu, J.C. et al., "BIST for Measuring Clock Jitter of Charge-Pump Phase-Locked Loops", IEEE Transactions on instrumentation and Measurement, Feb. 2008, 57(2):276-285.

Niitsu, K, et al., "CMOS Circuits to Measure Timing Jitter Using a Self-Referenced Clock and a Cascaded Time Difference Amplifier With Duty-Cycle Compensation", IEEE Journal of Solid-State Circuits, Nov. 2012, 47 (11):2701-2710.

* cited by examiner

JITTER NOISE DETECTOR

CROSS-REFERENCE TO RELATED APPLICATION

This application is a continuation of U.S. patent application Ser. No. 17/972,475, filed Oct. 24, 2022, which is a division of U.S. patent application Ser. No. 16/952,744, filed Nov. 19, 2020, which is a continuation application of U.S. patent application Ser. No. 15/944,217, filed Apr. 3, 2018, now U.S. Pat. No. 10,845,404, which claims priority to U.S. Provisional Patent Application No. 62/525,656, filed on Jun. 27, 2017, each of which are incorporated by reference herein in their entireties.

BACKGROUND

In electronic and/or telecommunication applications, jitter is a time deviation from a true periodicity of a presumably periodic signal. Among various causes of the jitter are electromagnetic interference (EMI) and crosstalk with other periodic or non-periodic signals. Such jitter is typically considered as a noise effect in a circuit, device or system. The jitter generally cause various issues for a respective circuit, device or system such as, for example, causing a display monitor to flicker, disadvantageously affecting an ability of a processor of a desktop or server to perform as originally intended operation, inducing clicks or other undesired effects in audio signals, loss of transmitted data between network devices, etc. Thus, there exists a need for a technique to accurately and quickly detect the presence of jitter in a circuit, device or system.

BRIEF DESCRIPTION OF THE DRAWINGS

Aspects of the present disclosure are best understood from the following detailed description when read with the accompanying figures. It is noted that various features are not necessarily drawn to scale. In fact, the dimensions of the various features may be arbitrarily increased or reduced for clarity of discussion.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

The present disclosure provides various embodiments of a jitter detection circuit that can accurately detect a presence of jitter in a clock signal. More particularly, in some embodiments, the disclosed jitter detection circuit compares respective transition edges (e.g., rising edges, falling edges, etc.) of the clock signal and a reference clock signal by using either a p-type or an n-type jitter detection circuit so as to determine whether the jitter is present in the clock signal in a real-time fashion. Moreover, in some embodiments, the p-type and n-type jitter detection circuits each includes a tuning circuit that allows the respective p-type and n-type jitter detection circuits to tune respective jitter detection sensitivities. In some embodiments, such a jitter detection sensitivity may be referred to as a minimum quantified amount of the jitter that can be detected, for example, a minimum timing offset window of either the rising edges or the falling edges between the clock signal and reference clock signal.

Figure 1:
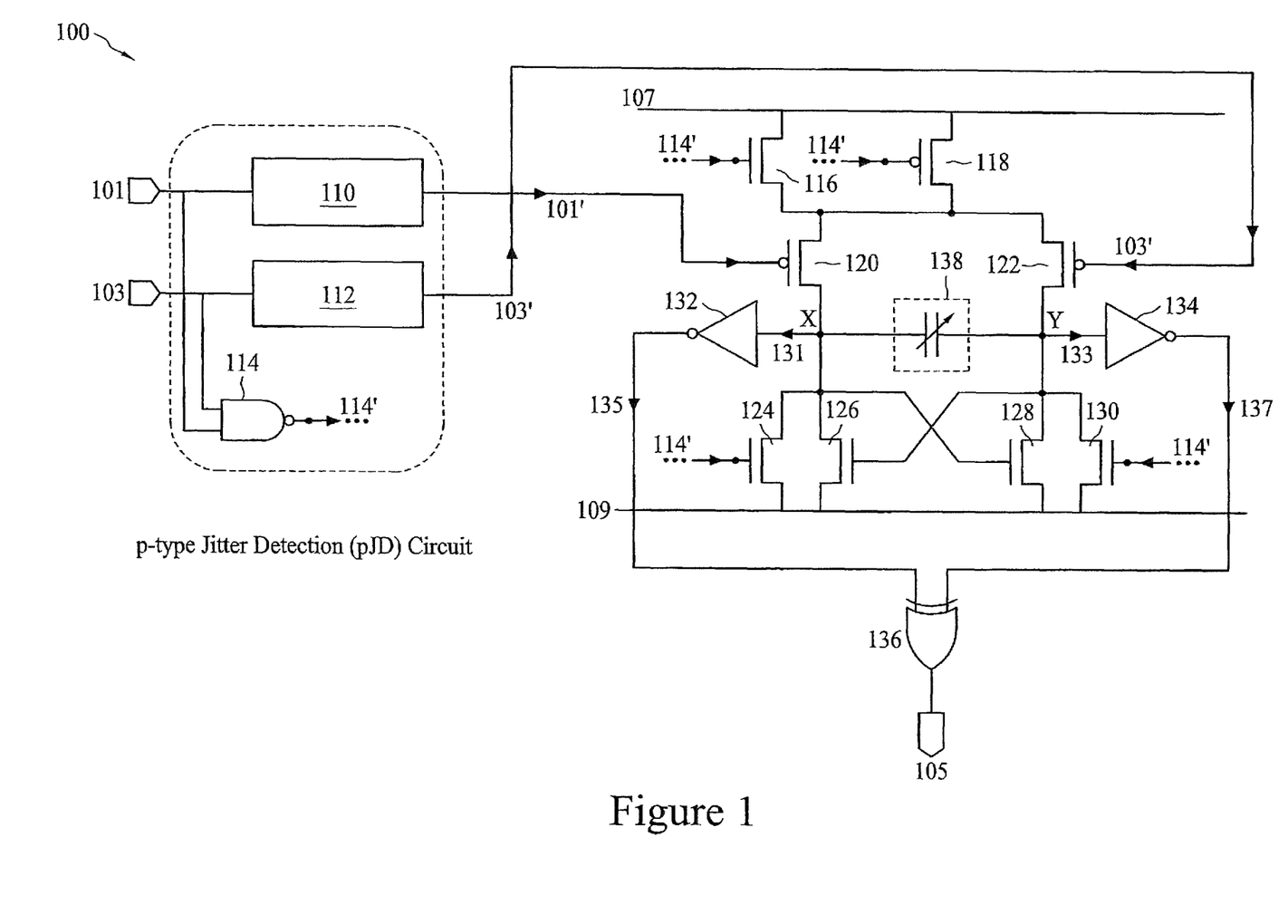
FIG. 1 illustrates an exemplary circuit diagram of a p-type jitter detection (pJD) circuit, in accordance with some embodiments.

FIG. 1 illustrates an exemplary circuit diagram of a p-type jitter detection circuit (hereinafter "pJD circuit") 100, in accordance with some embodiments. As mentioned above, the pJD circuit 100 is configured to compare respective transition edges between a clock signal (e.g., 101) and a reference clock signal (e.g., 103) so as to determine whether the clock signal 101 contains jitter that exceeds a pre-defined threshold (e.g., a pre-defined timing offset window $T_{os}$, which will be discussed in further detail below with respect to FIG. 3). If so, the pJD circuit 100 may output signal 105 at a high logic state (hereinafter "HIGH"). On the other hand, if no jitter is detected or the jitter in the clock signal 101 does not exceed the pre-defined threshold, the pJD circuit 100 may output the signal 105 at a low logic state (hereinafter "LOW").

In some embodiments, the pJD circuit 100 is configured to compare respective "rising" edges of the clock signal 101 and the reference clock signal 103. The clock signal 101 may be generated by a clock generation circuit, for example, a phase-locked-loop (PLL) circuit integrated in a bigger system circuit (e.g., a system-on-chip (SoC) circuit, an application-specific integrated circuit (ASIC), etc.). The reference clock signal 103 may be provided by an external crystal circuit, which is generally considered as a relatively reliable clock generation source, thus making the reference clock signal 103 a reliable reference. In some other embodiments, the reference clock 103 can be provided by either delaying the clock signal 101 by a pre-defined period of time or from another low-noise PLL, even off-chip instruments. The clock generation circuit, which provides the clock signal 101, may be configured to provide one or more synchronous or asynchronous functionalities to the bigger system circuit. Thus, by coupling the disclosed pJD circuit 100 to such a bigger system circuit, the clock signal 101 may be accurately monitored in a real-time manner, which will be described in further detail below with respect to FIG. 3.

Referring still to FIG. 1, in some embodiments, the pJD circuit 100 includes a first delay circuit 110, a second delay circuit 112, a logic gate 114, transistors 116, 118, 120, 122, 124, 126, 128, and 130, inverters 132 and 134, a logic gate 136, and a tuning circuit 138. In some embodiments, the first and second delay circuits 110 and 112 may each include a plurality of serially coupled buffers, inverters, or the like (not shown). The first delay circuit 110 is configured to receive the clock signal 101 and provide a delayed version of the clock signal, e.g., 101', and the second delay circuit 112 is configured to receive the reference clock signal 103 and provide a delayed version of the clock signal, e.g., 103'. In some embodiments, the logic gate 114 of the pJD circuit 100 may include a NAND logic gate that is configured to perform a NAND logic function on the clock signal 101 and the reference clock signal 103 so as to provide a control signal 114' based on a NAND'ed result of logic states of the clock signal 101 and the reference clock signal 103.

In some embodiments, the transistors 116, 124, 126, 128, and 130 may be each implemented by an n-type metal-oxide-semiconductor (NMOS) field-effect-transistor (FET), and the transistors 118, 120, and 122 may be each implemented by a p-type metal-oxide-semiconductor (PMOS) field-effect-transistor (FET). However, it is noted that the transistors 116 to 130 may each be implemented as any of various types of transistors (e.g., a bipolar junction transistor (BJT), a high-electron mobility transistor (HEMT), etc.) while remaining within the scope of the present disclosure.

More specifically, the transistors 116 and 118 are commonly coupled to a first supply voltage 107 (e.g., Vdd) at respective drain and source, and gated by the control signal 114'. The transistor 120 is coupled to the transistor 116's source by its respective source, and gated by the delayed clock signal 101'. Similarly, the transistor 122 is coupled to the transistor 118's drain by its respective source, and gated by the delayed reference clock signal 103'. And the transistor 118's drain is coupled to the transistor 116's source. The transistors 124 and 126 are coupled to a drain of the transistor 120 by their respective drains at a common node "X," and to a second supply voltage 109 (e.g., Vss or ground) by their respective sources. In some embodiments, the transistor 124 is gated by the control signal 114'. Similarly, the transistors 128 and 130 are coupled to a drain of the transistor 122 by their respective drains at a common node "Y," and to the second supply voltage 109 (e.g., Vss or ground) by their respective sources. In some embodiments, the transistor 130 is gated by the control signal 114'.

More specifically, in some embodiments, the transistors 126 and 128 are cross-coupled to each other. That is, a gate of the transistor 126 is coupled to the drain of the transistor 128 and a gate of the transistor 128 is coupled to the drain of the transistor 126 so as to allow the transistors 126 and 128 to function as a latch circuit, which will be discussed in further detail below with respect to FIG. 3.

In some embodiments, the inverters 132 and 134 are configured to receive signals present at nodes X and Y (hereinafter "signal 131" and "signal 133"), respectively, as respective input signals, and provide respective logically inverted signals 135 and 137. The signals 135 and 137 are received by the logic gate 136, which may be implemented as an XOR logic gate in some embodiments. The logic gate 136 is configured to perform an XOR logic function on the signals 135 and 137 so as to provide the signal 105 whose logic state is determined based on an XOR'ed result of logic states of the signals 135 and 137.

Figure 2A:
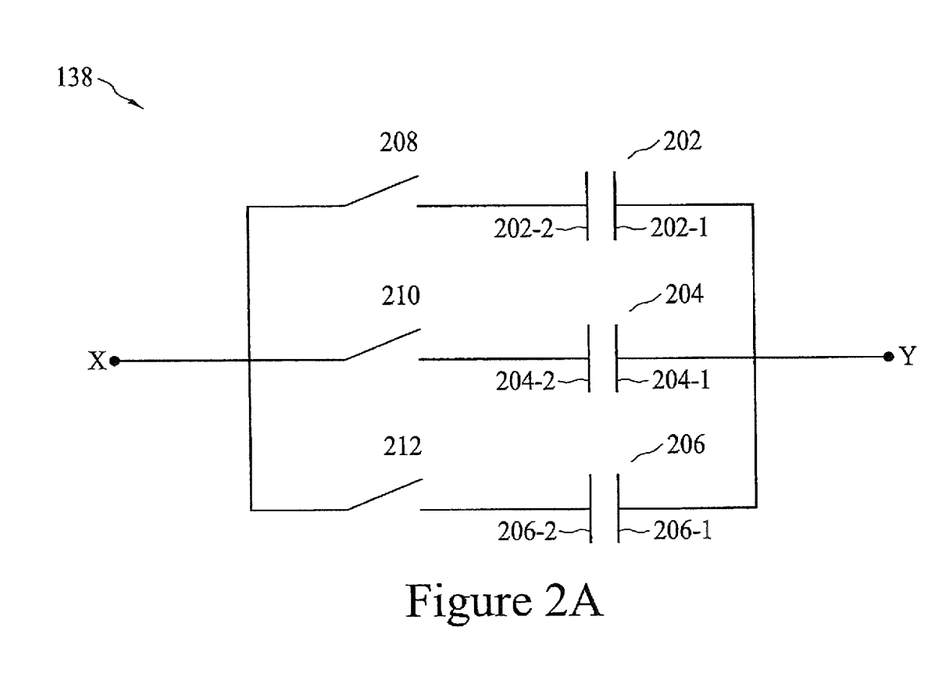
FIG. 2A illustrates an exemplary circuit diagram of a tuning circuit of the pJD circuit of FIG. 1, in accordance with some embodiments.

An exemplary circuit diagram of the tuning circuit 138 is illustrated in FIG. 2A. In some embodiments, the tuning circuit 138 includes one or more capacitors 202, 204, and 206 coupled between the nodes X and Y by respective switches 208, 210, and 212. More specifically, the capacitor 202 includes two conductive plates 202-1 and 202-2, wherein one conductive plate (e.g., 202-1) is coupled to the node Y and the other conductive plate (e.g., 202-2) is coupled to the node X through the switch 208; the capacitor 204 includes two conductive plates 204-1 and 204-2, wherein one conductive plate (e.g., 204-1) is coupled to the node Y and the other conductive plate (e.g., 204-2) is coupled to the node X through the switch 208; and the capacitor 206 includes two conductive plates 206-1 and 206-2, wherein one conductive plate (e.g., 206-1) is coupled to the node Y and the other conductive plate (e.g., 206-2) is coupled to the node X through the switch 208.

According to some embodiments, each of the switches 208, 210 and 212 may be selectively turned on/off to tune the jitter detection sensitivity, i.e., the pre-defined timing offset window $T_{os}$, of the pJD circuit 100. More specifically, when more switches are turned on, more capacitors are electrically coupled between the nodes X and Y, which causes the timing offset window $T_{os}$ to become wider. Conversely, when less switches are turned on, less capacitors are electrically coupled between the nodes X and Y, which causes the timing offset window $T_{os}$ to become narrower. As will be discussed in further detail below, such a timing offset window $T_{os}$ may be used to determine whether the logic states of the signals 131 (i.e., a voltage level at the node X) and 133 (i.e., a voltage level at the node Y) can be "latched" by the coupled latch circuit formed by the transistors 126 and 128. Although only three capacitors 202, 204 and 206 (and corresponding switches 208, 210 and 210) are shown in the illustrated embodiment of FIG. 2, it is understood that any desired number of capacitors (and corresponding switches) may be included in the tuning circuit 138.

Figure 2B:
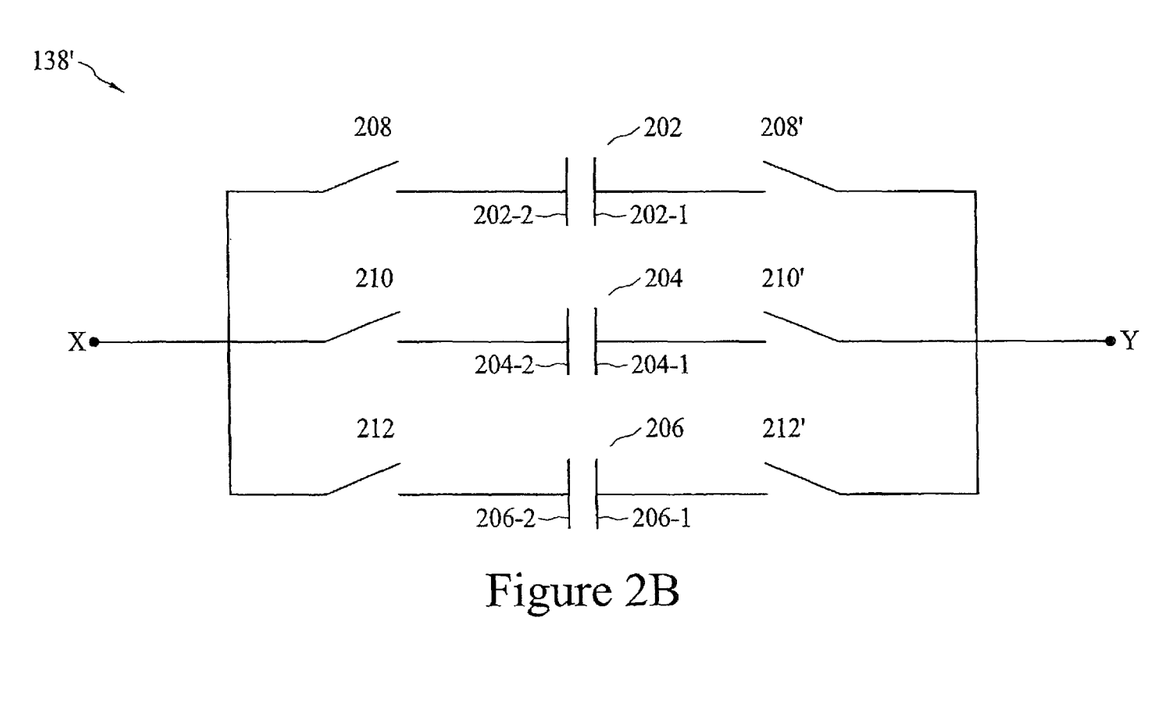
FIG. 2B illustrates another exemplary circuit diagram of the tuning circuit of the pJD circuit of FIG. 1, in accordance with some embodiments.

Another exemplary circuit diagram of the tuning circuit 138 is illustrated in FIG. 2B, which is herein referred to as tuning circuit 138', for purposes of clarity of illustration. In some embodiments, the tuning circuit 138' is substantially similar to the circuit diagram of the tuning circuit 138 shown in FIG. 2A except that the tuning circuit 138' further includes capacitors 208', 210' and 212'. In some embodiments, the capacitor 208' is coupled between the conductive plate 202-1 and the node Y; the capacitor 210' is coupled between the conductive plate 204-1 and the node Y; and the capacitor 212' is coupled between the conductive plate 206-1 and the node Y. Each of the capacitors 208', 210', and 212' are substantially similar to the capacitors 208, 210, and 212, respectively, in terms of functionality and configuration such that discussions of the capacitors 208', 210', and 212' are not repeated here.

Figure 3:
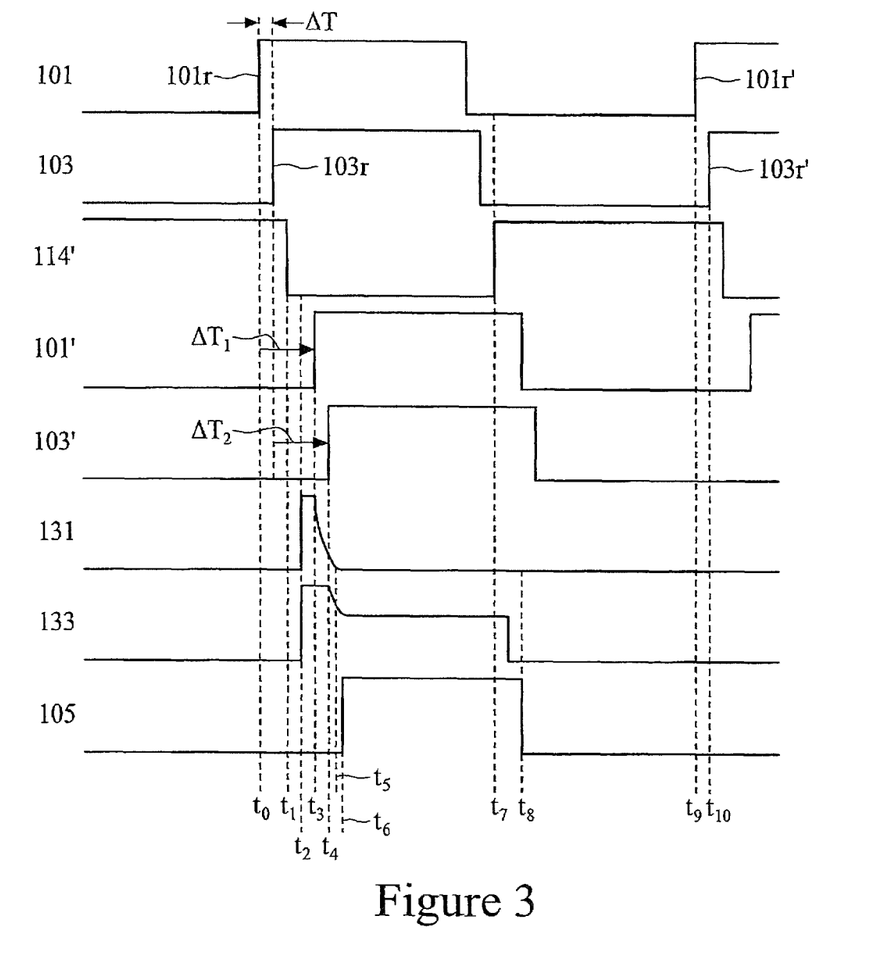
FIG. 3 illustrates exemplary waveforms of plural signals to operate the pJD circuit of FIG. 1, in accordance with some embodiments.

FIG. 3 illustrates exemplary waveforms of signals 101, 103, 114', 101', 103', 131, 133, and 105 to operate the pJD circuit 100 of FIG. 1, in accordance with some embodiments. Each waveform of the signals 101, 103, 114', 101', 103', 131, 133, and 105 illustrated in FIG. 3 varies between HIGH and LOW over time.

As mentioned above, jitter is a deviation from a true periodicity of a presumably periodic signal. In some embodiments, the reference clock signal 103 may be used as the "presumably periodic signal" that is used to examine the clock signal 101 and to determine whether a deviation of the clock signal 101 from the presumably periodic signal 103 exceeds the pre-defined timing offset window Ls. In some embodiments, when the clock signal 101 contains jitter (i.e., has a deviation) that exceeds the pre-defined timing offset window (i.e., an intolerable amount of jitter) on its respective rising edge, the pJD circuit 100 may pull the signal 105 to HIGH, as mentioned above. FIG. 3 illustrates a scenario where the clock waveform signal 101 contains jitter that exceeds a predetermined threshold, which is detected by the pJD circuit 100, and the corresponding signals that are used or generated by the pJD circuit 100 (i.e., signals 114', 101', 103', 131, 133 and 105).

As shown in FIG. 3, the clock signal 101's rising edge 101*r* deviates from the reference clock signal 103's rising edge 103*r*. More specifically, the rising edge 101*r* occurs "ΔT" ahead of the rising edge 103*r*. Alternative stated, the rising edges 101*r* and 103*r* have a timing difference ΔT from each other. As described above, the logic gate 114 performs the NAND logic function on the clock signal 101 and the reference clock signal 103. As known in the art, only when both the signals 101 and 103 transition to HIGH, the logic gate 114 can output the control signal 114' as LOW.

Prior to time "t0," the control signal 114' is at HIGH, and at time t0, the control signal 114' remains at HIGH because the logic states of the signals 101 and 103 are at LOW. It is noted that the transistors 116, 118, 124, and 130 are all gated by the signal 114'. Accordingly, when the control signal 114' is at HIGH, the "NMOS" transistors 116, 124, and 130 are turned on, and the "PMOS" transistor 118 is turned off. In some embodiments, the transistor 116 may serve as a pre-charge circuit to pre-charge the transistors 120 and 122, more specifically, the sources of the transistors 120 and 122, before the transistors 120 and 122 are turned off since, at time t0, the transistors 120 and 122 are turned on. The transistor 118 may serve as a current source after the control signal 114's is pulled to LOW, and the transistors 124 and 130 are configured to perform a reset function after the control signal 114's is pulled back to HIGH, which will be discussed further below, respectively. Moreover, in some embodiments, a respective size of the transistor 116 may be selected to be substantially smaller than other transistors (e.g., the transistors 120, 122, 124, 126, 128, and 130) such that prior to time t0 (e.g., before signal 114' transitions to LOW) a stand-by current (also known as a "DC current") may be minimized and respective logic states at nodes X and Y may remain at LOW. Thus, noise and/or false logic state(s), caused by the latch circuit formed by the transistors 126 and 128, can be advantageously avoided.

Subsequently, at time "t1," since both the clock signal 101 and the reference clock signal 103 have transitioned to HIGH, respectively, the (NAND) logic gate 114 transitions the control signal 114' to LOW, which turns off the transistor 116 and turn on the transistor 118 such that the transistor 116 may stop pre-charging the transistors 120 and 120 and the transistor 118 may start charging the voltage levels at nodes X and Y through the ON transistors 120 and 122, respectively. It is noted that because of signal propagation delays caused by the logic gate 114, the control signal 114' may not transition to LOW immediately after both signals 101 and 103 transition to HIGH. As mentioned above, the first and second delay circuits 110 and 112 respectively delay the clock signal 101 and the reference clock signal 103. More specifically, in some embodiments, the first delay circuit 110 may delay the clock signal 101 by a delay "ΔT$_1$" so as to provide the delayed signal 101' as shown; and the second delay circuit 112 may delay the clock signal 103 by a delay "ΔT$_2$" so as to provide the delayed signal 103' as shown. In some embodiments, the delays ΔT' and ΔT$_2$ may be substantially similar to each other.

At time "t2," because of the delays, rising edges of the delayed signals 101' and 103' have not been received by the "PMOS" transistors 120 and 122, i.e., the delayed signals 101' and 103' are still at LOW. Thus, the transistors 120 and 122 remain in the ON state. And the transistor 116 remains OFF and the transistor 118 remains ON because the control signal 114' has been pulled to LOW at time t1. The transistor 118, which serves as the current source as mentioned above, is configured to keep charging voltage levels at nodes X and Y. As such, the voltage levels at nodes X and Y (i.e., the signals 131 and 133) may be charged to HIGH through the ON transistors 120 and 122.

At time "t3," the rising edge of the delayed signal 101' is received by the gate of the transistor 120 so that the transistor 120 is turned off. Accordingly, the voltage level at the node X (i.e., the signal 131) starts being discharged through the transistor 126 at time t3. Similarly, at time "t4," the rising edge of the delayed signal 103' is received by the gate of the transistor 122 so that the transistor 122 is turned off. Accordingly, the voltage level at the node Y (i.e., the signal 133) starts being discharged through the transistor 128 at time t4. In some embodiments, because of the substantially similar delays ΔT$_1$ and ΔT$_2$, the timing difference "ΔT" between the rising edges 101*r* and 103*r* is reflected to the delayed signals 101' and 103' accordingly to turn off the transistors 120 and 122 at different times. The signals 131 and 133 may start being discharged at different times, i.e., the times t3 and t4 are different and the time t4 is subsequent to the time t3. As such, the signal 131 may transition to LOW faster than the signal 133. Moreover, as mentioned above, the transistors 126 and 128 function as a latch circuit. That is, once either one of the signals 131 and 133 transitions to a detectable logic state (e.g., a low enough voltage level), the logic states of the signals 131 and 133 may be latched to their current respective states. In a non-limiting example, when either one of the signals 131 and 133 transitions to a low enough voltage level, the logic state of the signal that transitions to the low enough voltage level may be latched to LOW, and the logic state of the other signal may be complementarily latched to HIGH (i.e., stops being discharged).

In the example of FIG. 3, since the signal 131 transitions to LOW (i.e., a low enough voltage level) at about time "t5" while the signal 133 is still being discharged, the logic states of the signals 131 and 133 may be latched to LOW and HIGH, respectively. That is, the signal 131 is latched to LOW and the signal 133 stops being discharged and latched to HIGH. As mentioned above, in some embodiments, the tuning circuit 138 determines the pre-defined timing offset window T$_{os}$, and the timing offset window T$_{os}$ is used to determine whether the signals 131 and 133 can be latched by the coupled latch circuit formed by the transistors 126 and 128, as explained below.

In an example, in a scenario where the signals 131 and 133 start discharging at the same time (i.e., t3=t4) or at two substantially close times (i.e., t4 is substantially close to t3), the logic states of the signals 131 and 133 become non-differentiable (i.e., both logic states of the signals 131 and 133 are at either HIGH or LOW), which causes the latch circuit formed by the transistors 126 and 128 to fail to latch a logic state within such a narrow timing difference between times t3 and t4. Alternatively stated, when the timing difference between times t3 and t4 becomes smaller than the timing offset window T$_{os}$, the latch circuit formed by the transistors 126 and 128 cannot latch signal 131 and signal 133 into inversed logic states (either HIGH or LOW).

On the other hand, as shown in FIG. 3, when the timing difference between times t3 and t4 exceeds the timing offset window T$_{os}$, the logic states of the signals 131 and 133 are differentiable because the logic state of the signal 131 transitions to LOW first. Accordingly, the latch circuit formed by the transistors 126 and 128 can latch the logic states of the signals 131 and 133 as LOW and HIGH, respectively. Subsequently, the signals 131 and 133 are logically inverted through the respective inverters 132 and 133 to become the signals 135 (now transitioning to HIGH) and 137 (now transitioning to LOW), as shown in FIG. 1.

At time "t6," the logic gate 136 performs the XOR logic function on the logically inverted signals 135 and 137. As known in the art, an XOR logic gate outputs a HIGH when inputs of the XOR logic gate are in different logic states. Accordingly, the (XOR) logic gate 136 transitions the signal 105 to HIGH at time t6. As mentioned above, when the signal 105 is pulled to HIGH, the pJD circuit 100 may thus determine that the deviation $\Delta T$ of the rising edge 101r (of the clock signal 101) from the rising edge 103' (of the reference clock signal 103) exceeds the pre-defined timing offset window $T_{os}$, in accordance with some embodiments.

Subsequently, at time "t7," since at least one of the clock signal 101 and the reference clock signal 103 transitioned to LOW, the control signal 114' (NAND'ing at least one LOW from either the signal 101 or signal 103) transitions to HIGH. Accordingly, the transistors 124 and 130 are turned on. As mentioned above, the transistors 124 and 130, in some embodiments, may form a reset circuit. That is, when the transistors 124 and 130 are turned on, such a reset circuit is enabled, which starts to discharge the signals 131 and 133. In some embodiments, the signal 133 may be pulled back to LOW slightly after time t7.

At time "t8," the signals 135 and 137 both transition to HIGH by logically inverting the signals 131 and 133 through the inverters 132 and 134, respectively, so that the signal 105 is reset to LOW (XOR'ing two HIGH's of the signals 135 and 137). It is noted that because of some signal propagation delays caused by the inverters 132 and 134, respectively, the signal 105 may not transition to LOW immediately after the signals 131 and 133 are pulled back to LOW. In some embodiments, after the signal 105 is reset to LOW, following the operations described above, the pJD circuit 100 may be configured to be ready to monitor whether a subsequent rising edge (e.g., 101r') of the clock signal 101 contains an intolerable amount of jitter when comparing to a rising edge (e.g., 103r') of the reference clock signal 103. The rising edge 101r' may be received by the first delay circuit 110 at a subsequent time (e.g., time "t9"), and the rising edge 103r' may be received by the second delay circuit 112 at another subsequent time (e.g., time "t10").

Figure 4:
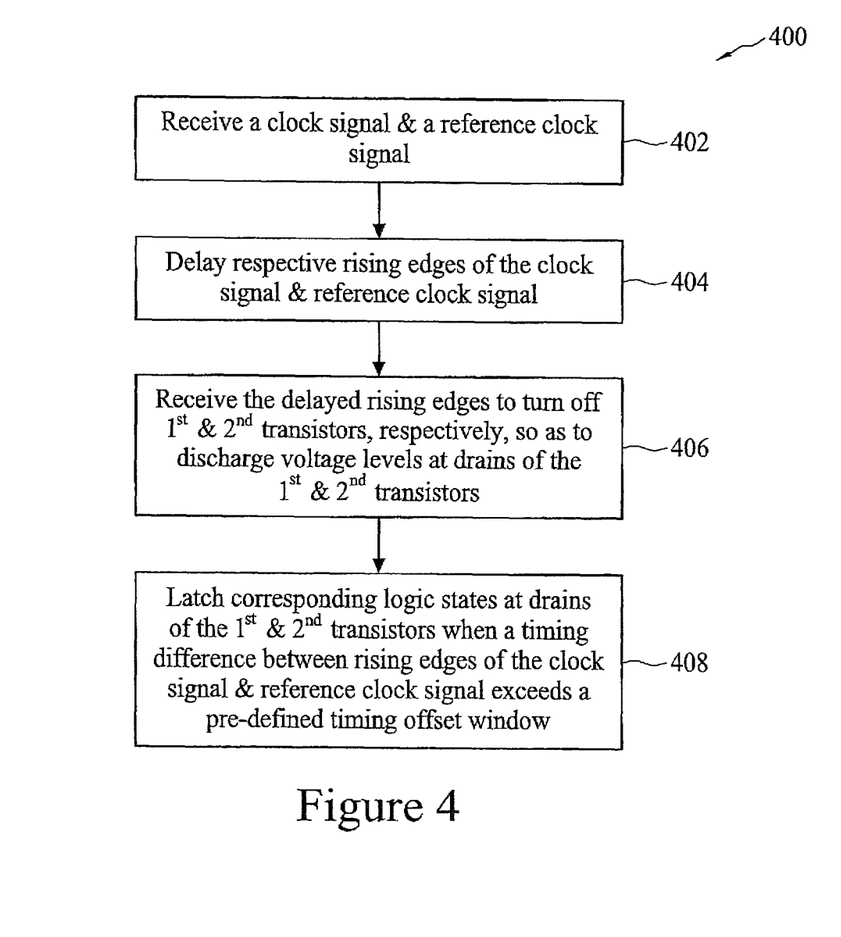
FIG. 4 illustrates an exemplary flow chart of a method to operate the pJD circuit of FIG. 1, in accordance with some embodiments.

FIG. 4 illustrates an exemplary flow chart of a method 400 to operate the pJD circuit 100 of FIG. 1, in accordance with some embodiments. In various embodiments, the operations of the method 400 are performed by the respective components illustrated in FIGS. 1-3. For purposes of discussion, the following embodiment of the method 400 will be described in conjunction with FIGS. 1-3. The illustrated embodiment of the method 400 is merely an example. Therefore, it should be understood that any of a variety of operations may be omitted, re-sequenced, and/or added while remaining within the scope of the present disclosure.

The method 400 starts with operation 402 in which a clock signal and a reference clock signal are received, in accordance with various embodiments. In the example illustrated in FIGS. 1-3, the clock signal 101 and the reference clock signal 103 that present the timing difference $\Delta T$ between their respective rising edges (101r and 103r) are received by the pJD circuit 100. The pJD circuit 100 is configured to detect whether the timing difference $\Delta T$ exceeds the pre-defined timing offset window Ls.

The method 400 continues to operation 404 in which respective rising edges of the clock signal and reference clock signal are delayed, in accordance with various embodiments. Continuing with the above example, the clock signal 101 is delayed by the first delay circuit 110 as the delayed signal 101', wherein the delayed signal 101' is $\Delta T_1$ behind the clock signal 101. The reference clock signal 103 is delayed by the second delay circuit 112 as the delayed signal 103', wherein the delayed signal 103' is $\Delta T_2$ behind the reference clock signal 103. As such, the respective rising edges 101r and 103r are delayed by $\Delta T_1$ and $\Delta T_2$, respectively. More specifically, in some embodiments, $\Delta T_1$ and $\Delta T_2$ are substantially similar to each other so that the timing difference $\Delta T$ may be reflected to the rising edges of the delayed signal 101' and 103'.

The method 400 continues to operation 406 in which the delayed rising edges are received by cross-coupled first and second transistors to cause the first and second transistors to be turned off respectively, such that voltage levels at respective drains of the first and second transistors start being discharged, in accordance with various embodiments. Continuing with the above example, since the delayed rising edges (i.e., the rising edges of the delayed signals 101' and 103') reflect the timing difference $\Delta T$ (between the rising edges 101r and 103r), the first transistor (e.g., 120) receives the rising edge of the delayed signal 101' before the second transistor (e.g., 122) received the rising edge of the delayed signal 103'. As such, the voltage level of the drain of the first transistor 120 may start being discharged before the voltage level of the drain of the second transistor 122 starts being discharged.

The method 400 continues to operation 408 in which corresponding logic states of the voltage levels at the drains of the first and second transistors are latched by the first and second transistors when the timing difference between the rising edges of the clock signal and the reference clock signal exceeds the pre-defined timing offset window $T_{os}$, in accordance with various embodiments. Still continuing with the above example, because of the timing difference $\Delta T$, the voltage level of the drain of the first transistor 120 starts being discharged first. The voltage level of the drain of the first transistor 120 may be discharged low enough to reach a corresponding LOW first while the voltage level of the drain of the second transistor 122 may be still being discharged (and not low enough to reach a corresponding LOW). As such, the logic state at the drain of the first transistor 120 may be latched to LOW, and the logic state at the drain of the second transistor 122 may be complementarily latched to HIGH. In some embodiments, the timing offset window $T_{os}$ may be pre-defined based on whether the cross-coupled first and second transistors 120 and 122 are able to latch a logic state at one drain of the transistors 120 and 122 within the timing difference $\Delta T$. In this case, the pJD circuit 100 may determine that the timing difference $\Delta T$ exceeds the pre-defined timing offset window Ls since the logic state at the drain of the first transistor 120 is able to be latched.

Figure 5:
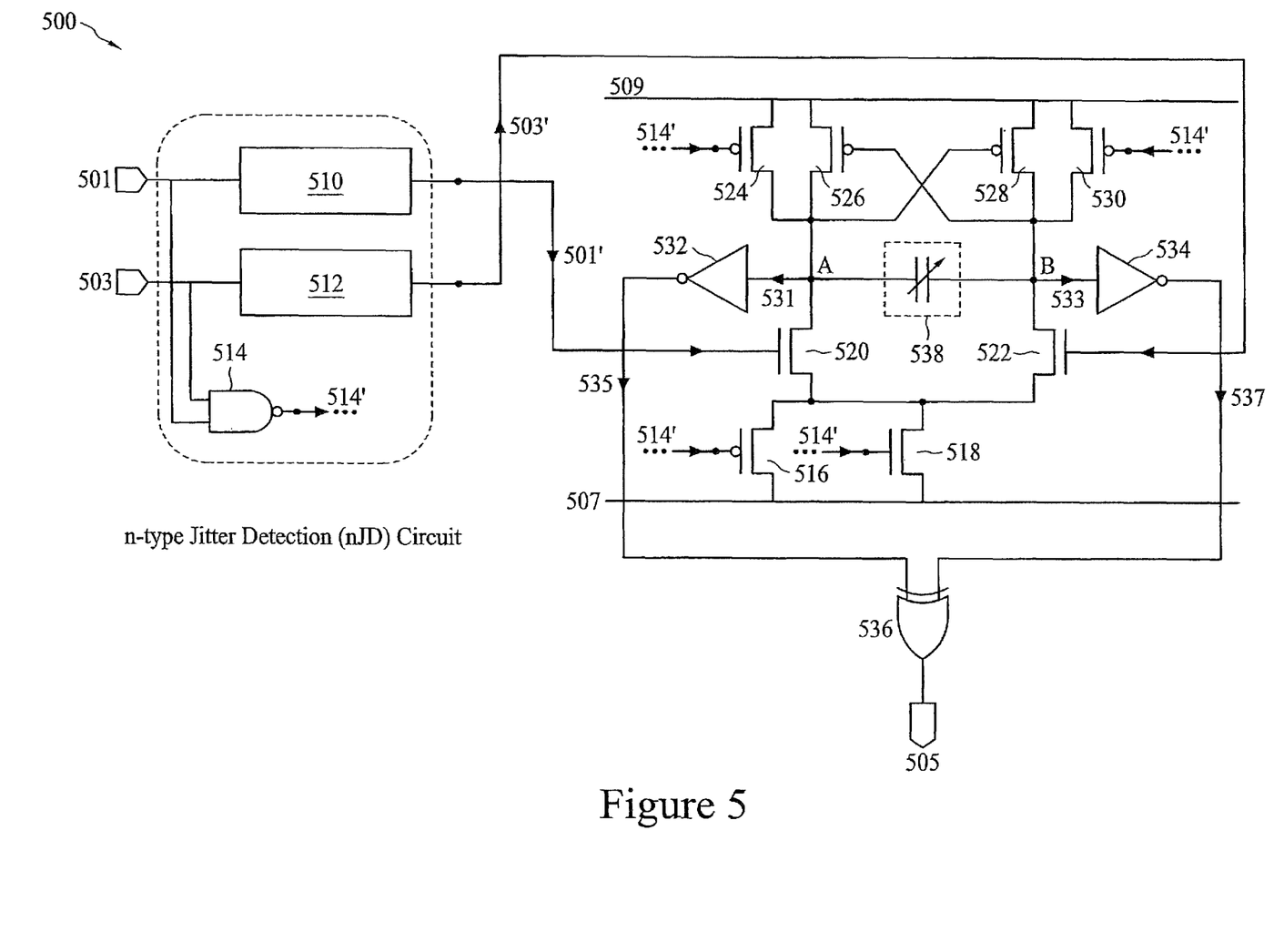
FIG. 5 illustrates a exemplary circuit diagram of an n-type jitter detection (nJD) circuit, in accordance with some embodiments.

FIG. 5 illustrates an exemplary circuit diagram of an n-type jitter detection circuit (hereinafter "nJD circuit") 500, in accordance with some embodiments. Similar to the pJD circuit 100, the nJD circuit 500 is configured to compare respective transition edges between a clock signal (e.g., 501) and a reference clock signal (e.g., 503) so as to determine whether the clock signal 501 contains jitter that exceeds a pre-defined threshold (e.g., the pre-defined timing offset window $T_{os}$ discussed above with respect to FIG. 3). If so, the nJD circuit 500 may output signal 505 at a high logic state (hereinafter "HIGH"). On the other hand, if no jitter is detected or the jitter in the clock signal 501 does not exceed the pre-defined threshold, the nJD circuit 500 may output the signal 505 at a low logic state (hereinafter "LOW").

In some embodiments, the clock signal 501 and the reference clock signal 503 are substantially similar to the clock signal 101 and the reference clock signal 103. For purposes of clarity, the clock signal and the reference clock signal will be referred to as the clock signal 501 and the reference clock signal 503, respectively, in the following discussions. Also, in some embodiments, the nJD circuit 500 is substantially similar to the pJD circuit 100 of FIG. 1 except that the nJD circuit 500 is configured to compare respective "falling" edges of the clock signal 501 and the reference clock signal 503 by using different types of transistors. Thus, the nJD circuit 500 will be briefly discussed below.

Similar to the pJD circuit 100, in some embodiments, the nJD circuit 500 includes a first delay circuit 510, a second delay circuit 512, a logic gate 514, transistors 516, 518, 520, 522, 524, 526, 528, and 530, inverters 532 and 534, a logic gate 536, and a tuning circuit 538. The tuning circuit 538 is substantially similar to the tuning circuit 138, which is described above with respect to FIG. 2. Also, the first and second delay circuits 510 and 512 may each include a plurality of serially coupled buffers, inverter, or the like (not shown). The first delay circuit 510 is configured to receive the clock signal 501 and provide a delayed version of the clock signal, e.g., 501', and the second delay circuit 512 is configured to receive the reference clock signal 503 and provide a delayed version of the clock signal, e.g., 503'.

Different from the pJD circuit 100, in some embodiments, the logic gate 514 of the nJD circuit 500 may include a NOR logic gate that is configured to perform a NOR logic function on the clock signal 501 and the reference clock signal 503 so as to provide a control signal 514' based on a NOR'ed result of logic states of the clock signal 501 and the reference clock signal 503. Further, the transistors 518, 520, and 522 may be each implemented by an NMOS FET, and the transistors 516, 524, 526, 528, and 530 may be each implemented by a PMOS FET. However, it is noted that the transistors 516 to 530 may be each implemented by any of various types of transistors (e.g., a bipolar junction transistor (BJT), a high-electron mobility transistor (HEMT), etc.) while remaining within the scope of the present disclosure.

In some embodiments, the transistors 516 and 518 are commonly coupled to a first supply voltage 507 (e.g., Vss or ground) at a respective drain and source, and gated by the control signal 514'. The transistor 520 is coupled to the transistor 516's source by its respective source, and gated by the delayed clock signal 501'. The transistor 522 is coupled to the transistor 518's drain by its respective source, and gated by the delayed reference clock signal 503'. And the transistor 518's drain is coupled to the transistor 516's source. The transistors 524 and 526 are coupled to a drain of the transistor 520 by their respective drains at a common node "A," and to a second supply voltage 509 (e.g., Vdd) by their respective sources. In some embodiments, the transistor 524 is gated by the control signal 514'. Similarly, the transistors 528 and 530 are coupled to a drain of the transistor 522 by their respective drains at a common node "B," and to the second supply voltage 509 (e.g., Vdd) by their respective sources. In some embodiments, the transistor 530 is gated by the control signal 514'.

More specifically, in some embodiments, the transistors 526 and 528 are cross-coupled to each other. That is, a gate of the transistor 526 is coupled to the drain of the transistor 528 and a gate of the transistor 528 is coupled to the drain of the transistor 526 so as to allow the transistors 526 and 528 to function as a latch circuit that is substantially similar to the latch circuit formed by the transistors 126 and 128 of the pJD circuit 100.

In some embodiments, the inverters 532 and 534 are configured to receive signals present at nodes A and B (hereinafter "signal 531" and "signal 533"), respectively, as respective input signals, and provide respective logically inverted signals 535 and 537. The signals 535 and 537 are received by the logic gate 536, which may be similarly implemented as an XOR logic gate in some embodiments. The logic gate 536 is configured to perform the XOR logic function on the signals 535 and 537 so as to provide the signal 505 whose logic state is determined based on an XOR'ed result of logic states of the signals 535 and 537.

Figure 6:
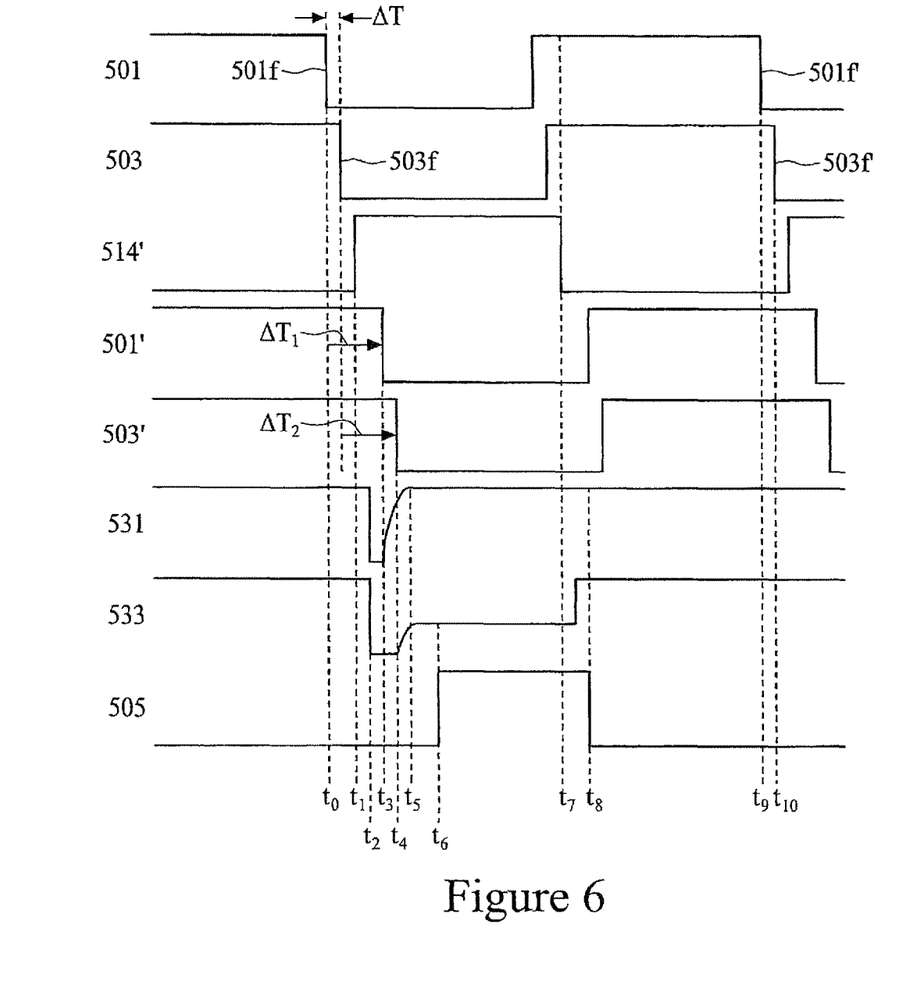
FIG. 6 illustrates exemplary waveforms of plural signals to operate the nJD circuit of FIG. 5, in accordance with some embodiments.

FIG. 6 illustrates exemplary waveforms of signals 501, 503, 514', 501', 503', 531, 533, and 505 to operate the nJD circuit 500 of FIG. 5, in accordance with some embodiments. Each waveform of the signals 501, 503, 514', 501', 503', 531, 533, and 505 illustrated in FIG. 6 varies between HIGH and LOW over time.

Similar to the operation of the pJD circuit 100, in some embodiments, the reference clock signal 503 may be used as the "presumably periodic signal," and the clock signal 501 may be used as a to-be examined signal to determine whether a deviation of the clock signal 501 from the presumably periodic signal 503 exceeds the pre-defined timing offset window $T_{os}$. When the clock signal 501 contains jitter (i.e., the deviation) that exceeds the pre-defined timing offset window (i.e., an intolerable amount of jitter) on its respective falling edge, the nJD circuit 500 may pull the signal 505 to HIGH. Accordingly, in order to explain how the "intolerable" jitter on the falling edge of the clock signal 501 is detected by the nJD circuit 500, in FIG. 6, the waveform of signal 501 (received by the nJD circuit 500) illustrates such a scenario and how the nJD circuit 500 responds by using signals 514', 501', 503', 531, and 533 to pull the signal 505 to HIGH.

As shown in FIG. 6, the clock signal 501's falling edge 501f is deviated from the refence clock signal 503's falling edge 503f. More specifically, the falling edge 501f occurs "ΔT" ahead of the falling edge 503f. Alternative stated, the rising edges 501f and 503f have a timing difference ΔT from each other. As described above, the logic gate 514 performs the NOR logic function on the clock signal 501 and the reference clock signal 503. As known in the art, only when both the signals 501 and 503 transition to LOW, the logic gate 514 can output the control signal 514' as HIGH.

Prior to time "t0," the control signal 514' is at LOW, and at time t0, the control signal 514' remains at LOW, because the logic states of the signals 501 and 503 are at HIGH. It is noted that the transistors 516, 518, 524, and 530 are all gated by the signal 514'. Accordingly, when the control signal 514' is at LOW, the "NMOS" transistor 518 is turned off and the "PMOS" transistors 516, 524, and 530 are turned on. In some embodiments, the transistor 516 may serve as a pre-discharge circuit to pre-discharge the transistors 520 and 522, more specifically, the sources of the transistors 520 and 522, before the transistors 520 and 522 are turned off, since, at time t0, the transistors 520 and 522 are turned on. The transistor 518 may serve as a current sink after the control signal 514's is pulled to HIGH, and the transistors 524 and 530 are configured to perform a reset function after the control signal 514's is pulled back to LOW, which will be discussed below, respectively. Moreover, in some embodiments, a respective size of the transistor 516 may be selected to be substantially smaller than other transistors (e.g., the transistors 520, 522, 524, 526, 528, and 530) such that prior to time t0 (e.g., before signal 514' transitions to HIGH) a stand-by current (also known as a "DC current") may be minimized and respective logic states at nodes A and B may remain at HIGH. Thus, noise and/or false logic state(s), caused by the latch circuit formed by the transistors 526 and 528, can be advantageously avoided.

Subsequently, at time "t1," since both the clock signal 501 and the reference clock signal 503 have transitioned to LOW, respectively, the (NOR) logic gate 514 transitions the control signal 514' to HIGH, which turns off the transistor 516 and turn on the transistor 518 such that the transistor 516 may stop pre-discharging the transistors 520 and 520 and the transistor 518 may start discharging the voltage levels at nodes A and B through the ON transistors 520 and 522, respectively. It is noted that because of a signal propagation delay caused by the logic gate 514, the control signal 514' may not transition to HIGH immediately after both signals 501 and 503 transition to LOW. As mentioned above, the first and second delay circuits 510 and 512 respectively delay the clock signal 501 and the reference clock signal 503. More specifically, in some embodiments, the first delay circuit 510 may delay the clock signal 501 by a delay "$\Delta T_1$" so as to provide the delayed signal 501' as shown; and the second delay circuit 512 may delay the clock signal 503 by a delay "$\Delta T_2$" so as to provide the delayed signal 503' as shown. In some embodiments, the delays $\Delta T_1$ and $\Delta T_2$ may be substantially similar to each other.

At time "t2," because of the delays, falling edges of the delayed signals 501' and 503' have not been received by the "NMOS" transistors 520 and 522, i.e., the delayed signals 501' and 503' are still at HIGH. Thus, the transistors 520 and 522 are remained ON. And the transistor 516 is remained OFF and the transistor 518 is remained ON because the control signal 514' has been pulled to HIGH at time t1. The transistor 518, served as the current sink as mentioned above, is configured to keep discharging voltage levels at nodes A and B. As such, the voltage levels at nodes A and B (i.e., the signals 531 and 533) may be discharged to LOW through the ON transistors 520 and 522.

At time "t3," the falling edge of the delayed signal 501' is received by the gate of the transistor 520 so that the transistor 520 is turned off. Accordingly, the voltage level at the node A (i.e., the signal 531) starts being charged through the transistor 526 at time t3. Similarly, at time "t4," the falling edge of the delayed signal 503' is received by the gate of the transistor 522 so that the transistor 522 is turned off. Accordingly, the voltage level at the node B (i.e., the signal 533) starts being charged through the transistor 528 at time t4.

In some embodiments, because of the substantially similar delays $\Delta T_1$ and $\Delta T_2$, the timing difference "$\Delta T$" between the falling edges 501$f$ and 503$f$ is reflected to the delayed signals 501' and 503' accordingly to turn off the transistors 520 and 522 at different times. The signals 531 and 533 may start being charged at different times, i.e., the times t3 and t4 are different and the time t4 is subsequent to the time t3. As such, the signal 531 may transition to HIGH faster than the signal 533. Moreover, as mentioned above, the transistors 526 and 528 function as a latch circuit. That is, once either one of the signals 531 and 533 transitions to a detectable logic state (e.g., a high enough voltage level), the logic states of the signals 531 and 533 may be latched as what they currently are. In a non-limiting example, when either one of the signals 531 and 533 transitions to a high enough voltage level, the logic state of the signal that transitions to the high enough voltage level may be latched to HIGH, and the logic state of the other signal may be complementarily latched to LOW (i.e., stops being charged).

In the example of FIG. 5, since the signal 531 transitions to HIGH (i.e., a high enough voltage level) at about time "t5" while the signal 533 is still being charged, the logic states of the signals 531 and 533 may be latched to HIGH and LOW, respectively. That is, the signal 531 is latched to HIGH and the signal 533 is stopped being charged and latched to LOW. And as mentioned above, in some embodiments, the tuning circuit 538 determines the pre-defined timing offset window $T_{os}$, and the timing offset window $T_{os}$ is used to determine whether the signals 531 and 533 can be latched by the coupled latch circuit formed by the transistors 526 and 528.

In an example, when the signals 531 and 533 start being charged at the same time (i.e., t3=t4) or at two substantially close times (i.e., t4 is substantially close to t3), the logic states of the signals 531 and 533 become non-differentiable (i.e., both logic states of the signals 531 and 533 are at either HIGH or LOW), which causes the latch circuit formed by the transistors 526 and 528 to fail to latch a logic state within such a narrow timing difference between times t3 and t4. Alternatively stated, when the timing difference between times t3 and t4 becomes smaller than the timing offset window $T_{os}$, the latch circuit formed by the transistors 526 and 528 cannot latch signal 531 and signal 533 into inversed logic states (either HIGH or LOW).

On the other hand, which is the case shown in FIG. 6, when the timing difference between times t3 and t4 exceeds the timing offset window $T_{os}$, the logic states of the signals 531 and 533 are differentiable because the logic state of the signal 531 transitions to HIGH first. Accordingly, the latch circuit formed by the transistors 526 and 528 can latch the logic states of the signals 531 and 533 as HIGH and LOW, respectively. Subsequently, the signals 531 and 533 are logically inverted through the respective inverters 532 and 534 to become the signals 535 (now transitioning to LOW) and 537 (now transitioning to HIGH).

At time "t6," the logic gate 536 performs the XOR logic function on the logically inverted signals 535 and 537. As described above, an XOR logic gate outputs a HIGH when inputs of the XOR logic gate are in different logic states. Accordingly, the (XOR) logic gate 536 transitions the signal 505 to HIGH at time t6. When the signal 505 is pulled to HIGH, the nJD circuit 500 may thus determine that the deviation $\Delta T$ of the rising edge 501$f$ (of the clock signal 501) from the rising edge 503' (of the reference clock signal 503) exceeds the pre-defined timing offset window Ls, in accordance with some embodiments.

Subsequently, at time "t7," since at least one of the clock signal 501 and the reference clock signal 503 transitioned to HIGH, the control signal 514' (NOR' ing at least one HIGH from either the signals 501 or signal 503) transitions to LOW. Accordingly, the transistors 524 and 530 are turned on. As mentioned above, the transistors 524 and 530, in some embodiments, may form a reset circuit. That is, when the transistors 524 and 530 are turned on, such a rest circuit is enabled, which starts to charge the signals 531 and 533. In some embodiments, the signal 533 may be pulled back to HIGH slightly after time t7.

At time "t8," the signals 535 and 537 both transition to LOW by logically inverting the signals 531 and 533 through the inverters 532 and 534, respectively, so that the signal 505 is reset to LOW (XOR'ing two LOW's of the signals 535 and 537). It is noted that because of some signal propagation delays caused by the inverters 532 and 534, respectively, the signal 505 may not transition to LOW immediately after the signals 531 and 533 are pulled back to HIGH. In some embodiments, after the signal 505 is reset to LOW, following the operations described above, the nJD circuit 500 may be configured to be ready to monitor whether a subsequent falling edge (e.g., 501*f*) of the clock signal 501 contains an intolerable amount of jitter when comparing to a falling edge (e.g., 503*f*) of the reference clock signal 503. The falling edge 501*f'* may be received by the first delay circuit 510 at a subsequent time (e.g., time "t9"), and the falling edge 503*f'* may be received by the second delay circuit 512 at another subsequent time (e.g., "t10").

Figure 7:
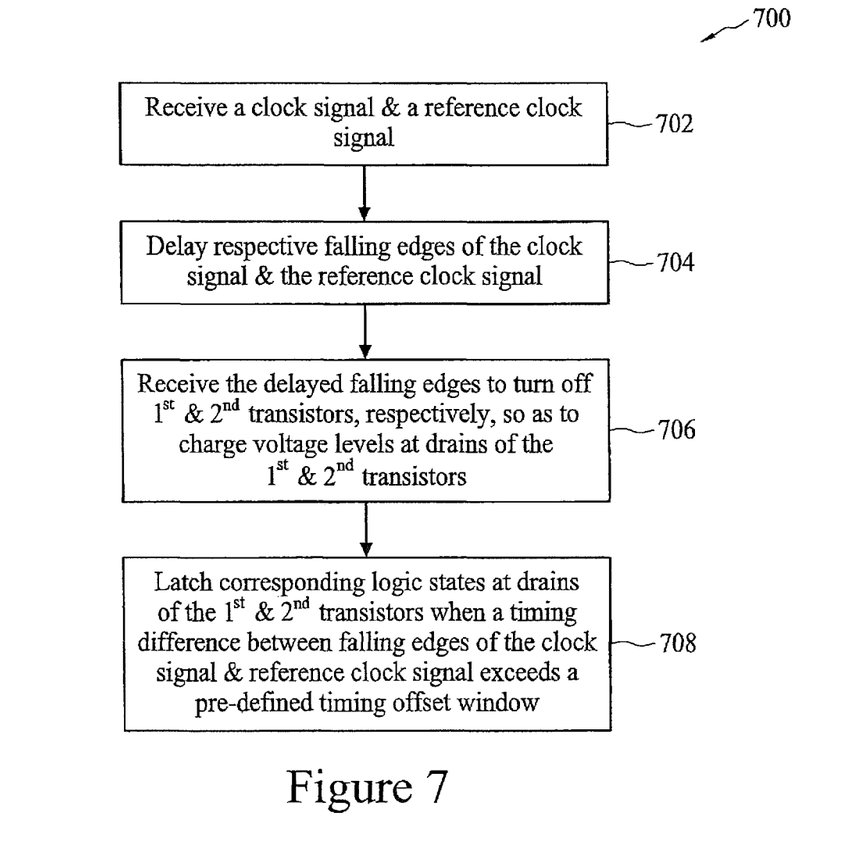
FIG. 7 illustrates an exemplary flow chart of a method to operate the nJD circuit of FIG. 5, in accordance with some embodiments.

FIG. 7 illustrates an exemplary flow chart of a method 700 to operate the nJD circuit 500 of FIG. 5, in accordance with some embodiments. In various embodiments, the operations of the method 700 are performed by the respective components illustrated in FIGS. 2, and 5-6. For purposes of discussion, the following embodiment of the method 700 will be described in conjunction with FIGS. 2, and 5-6. The illustrated embodiment of the method 700 is merely an example. Therefore, it should be understood that any of a variety of operations may be omitted, re-sequenced, and/or added while remaining within the scope of the present disclosure.

The method 700 starts with operation 702 in which a clock signal and a reference clock signal are received, in accordance with various embodiments. In the example illustrated in FIGS. 5-6, the clock signal 501 and the reference clock signal 503 that present the timing difference ΔT between their respective falling edges (501*f* and 503*f*) are received by the nJD circuit 500. The nJD circuit 500 is configured to detect whether the timing difference ΔT exceeds the pre-defined timing offset window Ls.

The method 700 continues to operation 704 in which respective falling edges of the clock signal and reference clock signal are delayed, in accordance with various embodiments. Continuing with the above example, the clock signal 501 is delayed by the first delay circuit 510 as the delayed signal 501', wherein the delayed signal 501' is ΔT$_1$ behind the clock signal 501. The reference clock signal 503 is delayed by the second delay circuit 512 as the delayed signal 503', wherein the delayed signal 503' is ΔT$_2$ behind the reference clock signal 503. As such, the respective falling edges 501*f* and 503*f* are delayed by ΔT$_1$ and ΔT$_2$, respectively. More specifically, in some embodiments, ΔT$_1$ and ΔT$_2$ are substantially similar to each other so that the timing difference ΔT may be reflected to the falling edges of the delayed signal 501' and 503'.

The method 700 continues to operation 706 in which the delayed falling edges are received by cross-coupled first and second transistors to cause the first and second transistors to be turned off respectively, such that voltage levels at respective drains of the first and second transistors start being charged, in accordance with various embodiments. Continuing with the above example, since the delayed falling edges (i.e., the falling edges of the delayed signals 501' and 503') reflect the timing difference ΔT (between the falling edges 501*r* and 503*r*), the first transistor (e.g., 520) receives the falling edge of the delayed signal 501' before the second transistor (e.g., 522) received the falling edge of the delayed signal 503'. As such, the voltage level of the drain of the first transistor 520 may start being charged before the voltage level of the drain of the second transistor 522 starts being discharged.

The method 700 continues to operation 708 in which corresponding logic states of the voltage levels at the drains of the first and second transistors are latched by the first and second transistors when the timing difference between the falling edges of the clock signal and the reference clock signal exceeds the pre-defined timing offset window T$_{os}$, in accordance with various embodiments. Still continuing with the above example, because of the timing difference ΔT, the voltage level of the drain of the first transistor 520 starts being charged first. The voltage level of the drain of the first transistor 520 may be charged high enough to reach a corresponding HIGH first while the voltage level of the drain of the second transistor 522 may be still being charged (and not high enough to reach a corresponding HIGH). As such, the logic state at the drain of the first transistor 520 may be latched to HIGH, and the logic state at the drain of the second transistor 522 may be complementarily latched to LOW. In some embodiments, the timing offset window T$_{os}$ may be pre-defined based on whether the cross-coupled first and second transistors 520 and 522 are able to latch a logic state at one drain of the transistors 520 and 522 within the timing difference ΔT. In this case, the nJD circuit 500 may determine that the timing difference ΔT exceeds the pre-defined timing offset window T$_{os}$ since the logic state at the drain of the first transistor 520 is able to be latched.

In an embodiment, a noise detection circuit includes a first transistor configured to receive a delayed version of a clock signal; a second transistor configured to receive a delayed version of a reference clock signal; and a latch circuit, coupled to the first transistor at a first node and coupled to the second transistor at a second node, and configured to latch logic states of voltage levels at the first and second nodes, respectively, based on whether a timing difference between transition edges of the clock signal and the reference clock signal exceeds a pre-defined timing offset threshold.

In another embodiment, a noise detection circuit includes a first transistor configured to receive a delayed version of a clock signal; a second transistor configured to receive a delayed version of a reference clock signal; a latch circuit, coupled to the first transistor at a first node and coupled to the second transistor at a second node, and configured to latch logic states of voltage levels at the first and second nodes, respectively, based on whether a timing difference between transition edges of the clock signal and the reference clock signal exceeds a pre-defined timing offset threshold; and a plurality of capacitors coupled between the first and second nodes.

Yet in another embodiment, a method includes receiving a clock signal and a reference clock signal, wherein at least a transition edge of the clock signal is deviated from a transition edge of the reference clock signal by a timing difference; delaying the clock signal and the reference clock signal; receiving the delayed clock signal and reference clock signal by a first transistor and a second transistor, respectively, so as to start either discharging or charging voltage levels at drains of the first and second transistors at different times; and latching respective logic states of the voltage levels at drains of the first and second transistors when the timing difference is greater than a pre-defined timing offset threshold.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A noise detection circuit, comprising:
a first component configured to receive a clock signal;
a second component configured to receive a reference clock signal; and
a latch circuit, coupled to the first component at a first node and coupled to the second component at a second node, and configured to latch logic states of voltage levels at the first and second nodes, respectively, based on a timing difference between transition edges of the clock signal and the reference clock signal,
wherein when the timing difference between transition edges of the clock signal and the reference clock signal exceeds a pre-defined timing offset threshold, the latch circuit is configured to latch the logic states of the voltage levels at the first and second nodes.

2. The circuit of claim 1, further comprising:
a first delay circuit configured to provide a delayed version of the clock signal to the first component; and
a second delay circuit configured to provide a delayed version of the reference clock signal to the second component.

3. The circuit of claim 2, wherein the latch circuit comprises a first p-type metal-oxide-semiconductor (PMOS) field-effect-transistor (FET) and a second PMOS FET that are cross-coupled to each other.

4. The circuit of claim 3, wherein the first node is commonly coupled by a drain of the first PMOS FET and a gate of the second PMOS FET, and the second node is commonly coupled by a drain of the second PMOS FET and a gate of the first PMOS FET.

5. The circuit of claim 1, wherein the first and second components each comprises an n-type metal-oxide-semiconductor (NMOS) field-effect-transistor (FET).

6. The circuit of claim 1, wherein the pre-defined timing offset threshold is tunable based on a number of capacitors coupled between the first and second nodes.

7. The circuit of claim 1, wherein the logic states of the voltage levels at the first and second nodes are complementary to each other.

8. A noise detection circuit, comprising:
a first n-type metal-oxide-semiconductor (NMOS) field-effect-transistor (FET) configured to receive a clock signal;
a second NMOS FET configured to receive a reference clock signal; and
a latch circuit, coupled to the first NMOS FET at a first node and coupled to the second NMOS FET at a second node, and configured to latch logic states of voltage levels at the first and second nodes, respectively, based on a timing difference between transition edges of the clock signal and the reference clock signal,
wherein when the timing difference between transition edges of the clock signal and the reference clock signal exceeds a pre-defined timing offset threshold, the latch circuit is configured to latch the logic states of the voltage levels at the first and second nodes.

9. The circuit of claim 8, further comprising a plurality of capacitors coupled between the first and second nodes.

10. The circuit of claim 8, wherein the latch circuit comprises a first p-type metal-oxide-semiconductor (PMOS) field-effect-transistor (FET) and a second PMOS FET that are cross-coupled to each other.

11. The circuit of claim 10, wherein the first node is commonly coupled by a drain of the first NMOS FET, a drain of the first PMOS FET, and a gate of the second PMOS FET.

12. The circuit of claim 11, wherein the second node is commonly coupled by a drain of the second NMOS FET, a drain of the second PMOS FET, and a gate of the first PMOS FET.

13. The circuit of claim 12, wherein the pre-defined timing offset threshold is tunable based on a number of capacitors coupled between the first and second nodes.

14. The circuit of claim 12, wherein the logic states of the voltage levels at the first and second nodes are complementary to each other.

15. A method, comprising:
receiving a clock signal and a reference clock signal, wherein at least a transition edge of the clock signal is deviated from a transition edge of the reference clock signal by a timing difference;
receiving the clock signal and the reference clock signal by a first transistor and a second transistor, respectively, to start either discharging or charging voltage levels at drains of the first and second transistors at different times; and
latching, by a latch circuit coupled to the first transistor at a first node and coupled to the second transistor at a second node, respective logic states of the voltage levels at the drains of the first and second transistors when the timing difference is greater than a pre-defined timing offset threshold,
wherein when the timing difference between transition edges of the clock signal and the reference clock signal exceeds the pre-defined timing offset threshold, the latch circuit is configured to latch the logic states of the voltage levels at the first and second nodes.

16. The method of claim 15, wherein the logic states of the voltage levels are complementary to each other.

17. The method of claim 15, further comprising:
delaying the clock signal; and
delaying the reference clock signal.

18. The method of claim 15, further comprising:
performing a NOR logic function on the clock signal and the reference clock signal to provide a control signal.

19. The method of claim 18, further comprising:
pre-discharging the first and second transistors when the control signal is at a low logic state, and when the first and second transistors are turned on; and
discharging the voltage levels at the first and second nodes when the control signal is at a high logic state, and when the first and second transistors are turned on.

20. The method of claim 15, wherein the pre-defined timing offset threshold is tunable based on a number of capacitors coupled between the drains of the first and second transistors.

* * * * *